(12) United States Patent  (10) Patent No.: US 8,679,936 B1
Budri et al.  (45) Date of Patent: Mar. 25, 2014

(54) MANUFACTURING RESISTORS WITH TIGHTENED RESISTIVITY DISTRIBUTION IN SEMICONDUCTOR INTEGRATED CIRCUITS

(75) Inventors: Thanas Budri, Portland, ME (US); Jerald M. Rock, Windham, ME (US); Randy Supczak, South Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1314 days.

(21) Appl. No.: 11/138,031

(22) Filed: May 26, 2005

(51) Int. Cl.
*H01L 21/20* (2006.01)

(52) U.S. Cl.
USPC ........... 438/382; 438/305; 438/306; 438/308; 438/385; 257/E27.047

(58) Field of Classification Search
USPC .......... 438/382–385; 439/301–308, 382–385; 257/E27.047
See application file for complete search history.

(56) References Cited

U.S. PATENT DOCUMENTS

| 4,113,515 | A | * | 9/1978 | Kooi et al. | 438/287 |
| 5,356,825 | A | * | 10/1994 | Hozumi et al. | 438/385 |
| 6,214,682 | B1 | * | 4/2001 | Wang | 438/301 |
| 6,277,677 | B1 | * | 8/2001 | Lee | 438/142 |
| 2005/0014316 | A1 | * | 1/2005 | Hirano et al. | 438/166 |

\* cited by examiner

*Primary Examiner* — H. Jey Tsai
(74) *Attorney, Agent, or Firm* — Eugene C. Conser; Wade J. Brady, III; Frederick J. Telecky, Jr.

(57) ABSTRACT

An anneal recipe is provided to tighten the distribution of resistance values in the manufacture of semiconductor integrated circuits. An adjusted amount of dopant is implanted to compensate for a shift in the distribution of resistance values associated with the anneal recipe. The distribution tightening can be effectuated by including an ammonia gas flow in the anneal recipe.

20 Claims, 7 Drawing Sheets

MANUFACTURING RESISTORS WITH TIGHTENED RESISTIVITY DISTRIBUTION IN SEMICONDUCTOR INTEGRATED CIRCUITS

TECHNICAL FIELD OF THE INVENTION

The invention relates generally to manufacturing semiconductor integrated circuits and, more particularly, to manufacturing resistors in semiconductor integrated circuits.

BACKGROUND OF THE INVENTION

Figure 1:
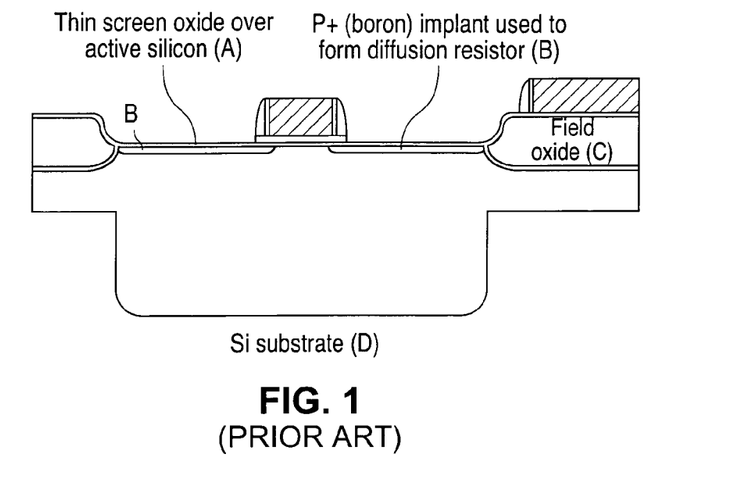
FIGS. 1-3 illustrate selected stages of the manufacture of resistors in semiconductor integrated circuits according to the prior art.

A well known part of the process of manufacturing semiconductor integrated circuits is the manufacturing of resistors in semiconductor integrated circuits. FIG. 1 illustrates pertinent portions of a prior art process of manufacturing a resistor in a semiconductor integrated circuit. A region of a semiconductor substrate D, for example a silicon substrate, has implanted therein a dopant, for example a P+ dopant such as Boron, to form a doped semiconductor region (diffusion resistor) B. The dopant is implanted through a thin (e.g., 7 nm) screen oxide A. The resulting structure is subsequently subjected to an annealing process, for example a Rapid Thermal Anneal process.

Figure 2:
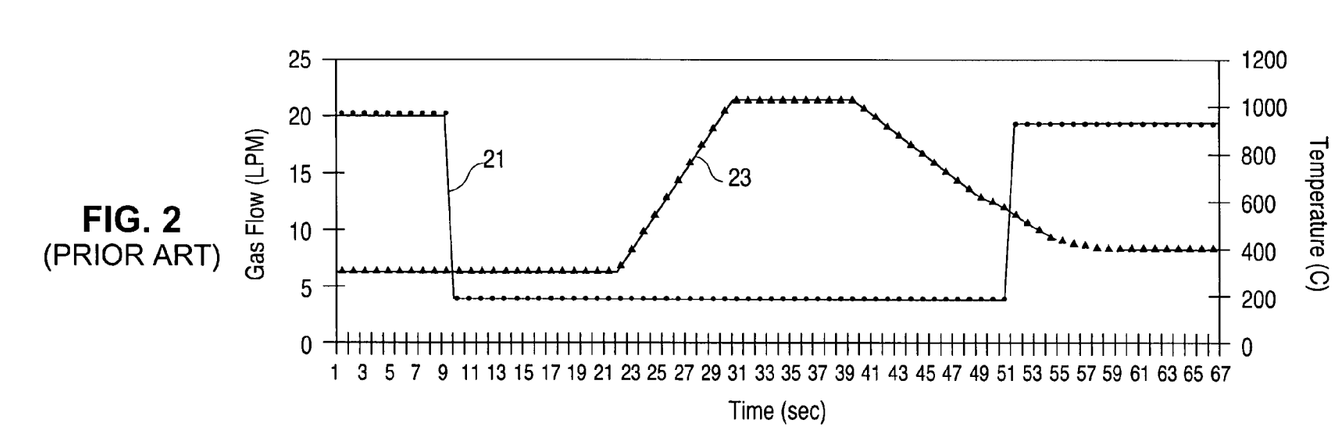
Figure 3:
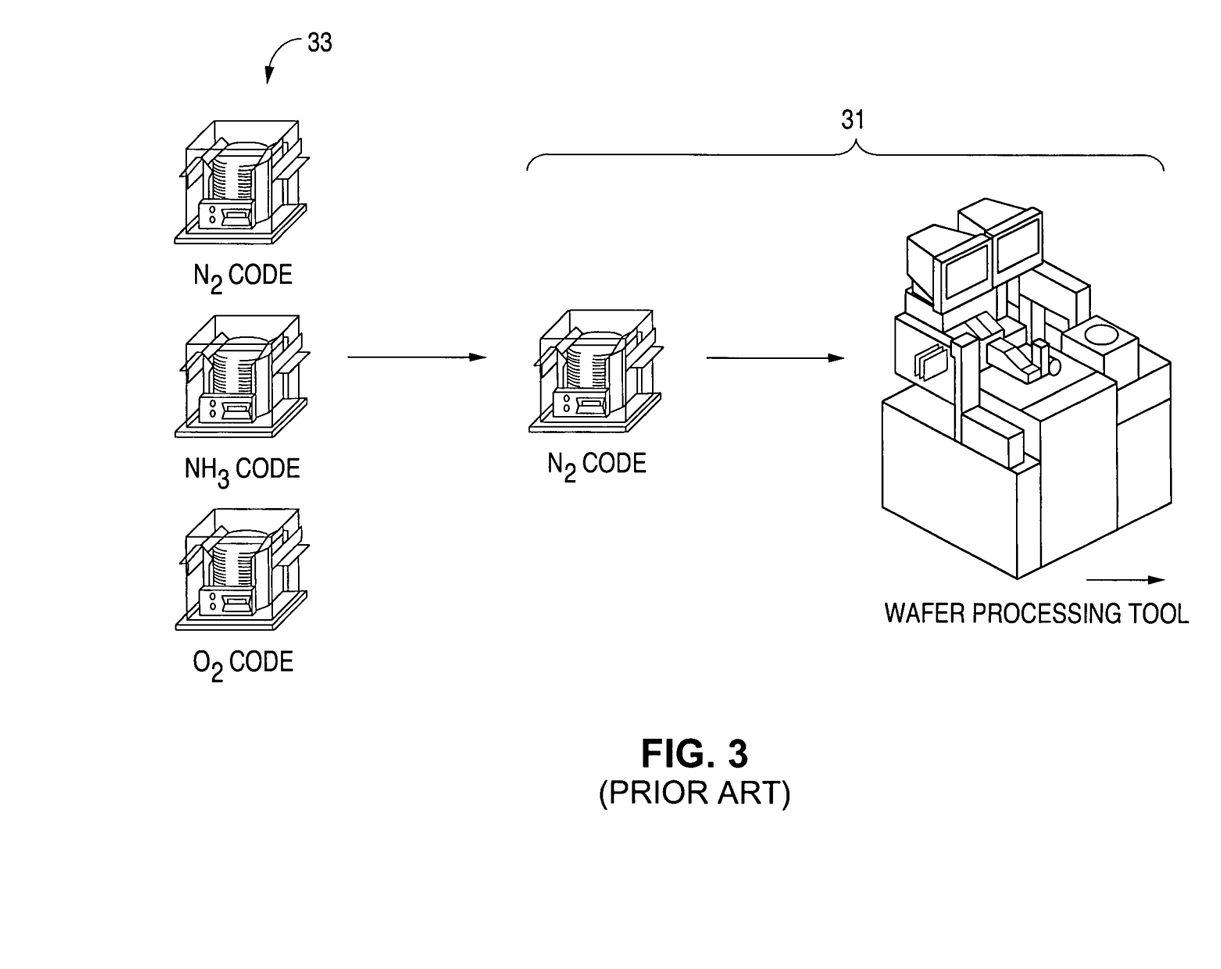

FIG. 2 graphically illustrates an example of an anneal recipe used in a prior art Rapid Thermal Anneal process. FIG. 2 illustrates gas flow 21 and temperature 23 versus time. The gas flow is shown in liters per minute (LPM), and the temperature is shown in degrees centigrade (° C.). In the example of FIG. 2, the gas flow illustrated at 21 is a nitrogen ($N_2$) gas flow. Depending on the particular integrated circuit that is being manufactured, and the particular manufacturing process that is being employed, the use of nitrogen gas flow in the wafer processing tool during the anneal step can be preceded by the use of various other types of process gases in the wafer processing tool during performance of earlier steps of the manufacturing process. This is illustrated generally in FIG. 3, where any of the process gases illustrated at 33 can be utilized in steps which precede the use of nitrogen process gas in the anneal step at 31. In FIG. 3, the possible predecessor gases shown at 33 are nitrogen, ammonia ($NH_3$) and oxygen ($O_2$). Various other process gases could also be used in the wafer processing tool during manufacturing steps which precede the nitrogen-based anneal step 31.

One important parameter in manufacturing resistors in semiconductor integrated circuits is the distribution of the actual resistance values of the manufactured resistors with respect to the target or desired resistance value. A tighter distribution results in a higher usable yield and more competitive pricing.

It is desirable in view of the foregoing to provide for a tight distribution of resistance values when manufacturing resistors in semiconductor integrated circuits.

SUMMARY OF THE INVENTION

Exemplary embodiments of the invention utilize an anneal recipe that tightens the distribution of resistance values. An adjusted amount of dopant is implanted to compensate for a shift in the distribution of resistance values associated with the anneal recipe. Some embodiments effectuate the distribution tightening by including an ammonia gas flow in the anneal recipe. In some embodiments, the anneal recipe reduces diffusion of dopant from the doped semiconductor material into the screen oxide layer, thereby tightening the resistivity distribution.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 11, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged semiconductor integrated circuit manufacturing system.

Figure 4:
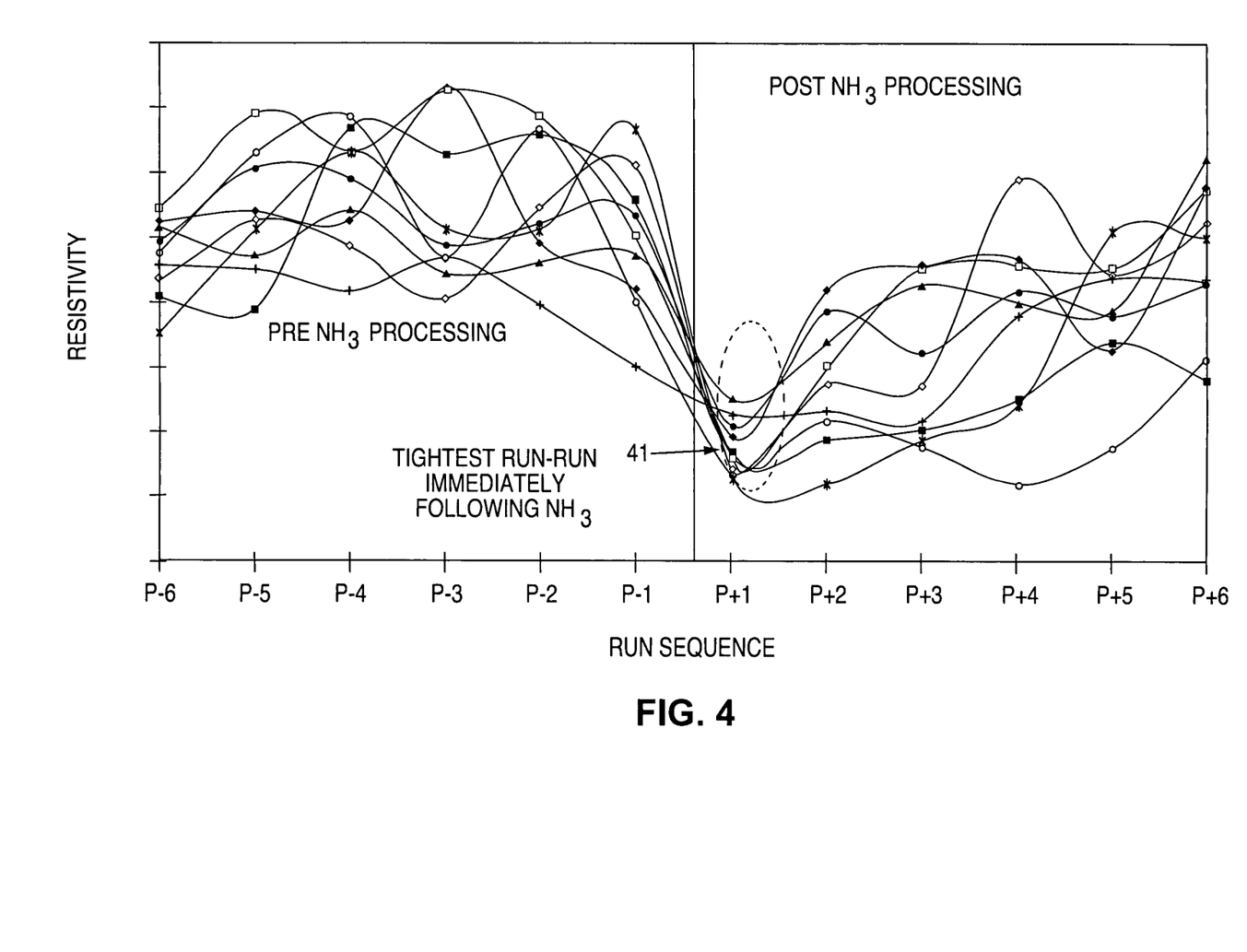
FIG. 4 graphically illustrates tighter resistivity distributions obtained according to the invention when the anneal step is exposed to ammonia gas.

The present invention recognizes that, as shown in FIG. 4, when an anneal process using nitrogen gas flow is performed in a processing chamber after ammonia was previously used in that chamber as a process gas, the resulting resistivity distribution is tighter (range of variation is narrower). Moreover, over 9 different wafer processing series, as shown in FIG. 4, the tightest resistivity distribution among the 9 series was observed in the wafers that were annealed using nitrogen as the process gas in a chamber wherein ammonia gas had been used as the process gas in the immediately preceding process step performed in that chamber. This is indicated at 41 in FIG. 4. FIG. 4 therefore demonstrates that the presence of residual ammonia gas (also termed an ammonia gas memory effect) in the processing chamber used to perform nitrogen-based annealing can produce a tighter distribution of resistivity values.

Figure 5:
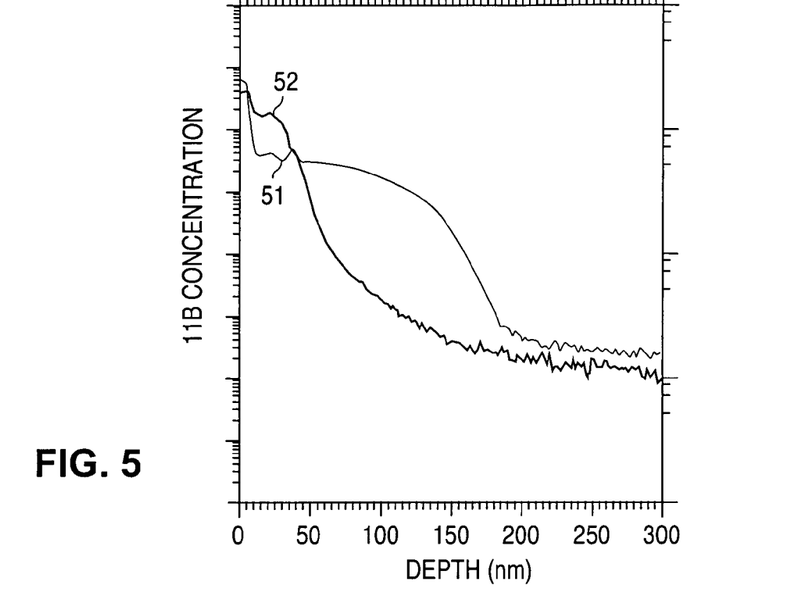
FIG. 5 graphically illustrates Boron dopant levels in resistors of respective wafers that were annealed using nitrogen-based and ammonia-based recipes.

FIG. 5 illustrates at 51 the Boron concentration (in normalized units) in the resistors of a wafer that was annealed using nitrogen process gas (i.e., a nitrogen-based anneal recipe) and without following a process step that used ammonia process gas in the chamber. FIG. 5 also illustrates at 52 the Boron concentration in the resistors of a wafer that was annealed using ammonia as the process gas (i.e., an ammonia-based anneal recipe). The doped resistor region begins at a depth of about 7 nm (e.g., below the thin screen oxide A of FIG. 1). As shown in the exemplary 11B Boron depth profile of FIG. 5, the Boron concentration obtained from the ammonia-based anneal recipe at 52 is substantially higher than the Boron concentration obtained from the nitrogen-based anneal recipe at 51.

Figure 6:
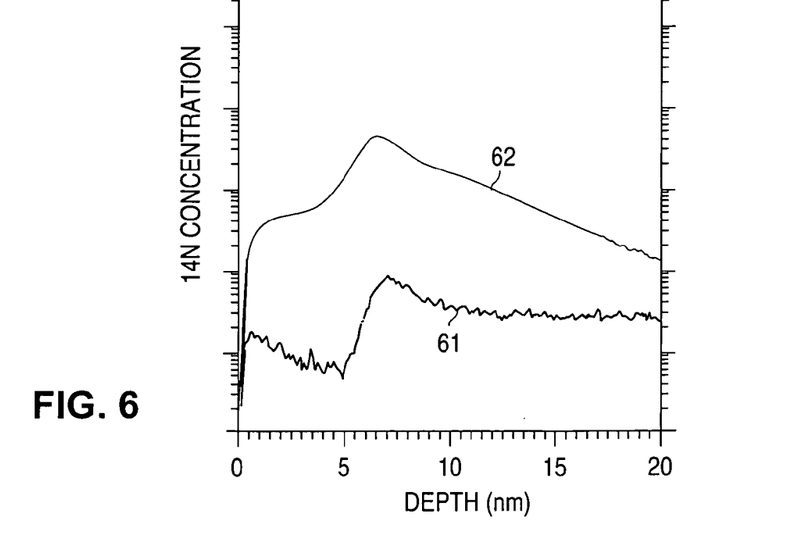
FIG. 6 graphically illustrates nitrogen levels incorporated into the screen oxides as a result of nitrogen-based and ammonia-based anneal recipes.

FIG. 6 graphically illustrates nitrogen content curves 61 and 62 (in normalized units) which represent 14N nitrogen levels in the screen oxides above the resistors having the respective Boron levels 51 and 52 shown in FIG. 5. As shown by FIG. 6, within the 7 nm screen oxide, the nitrogen levels at 62 associated with the ammonia-based anneal recipe (see also 52 in FIG. 5) are substantially higher than the nitrogen levels at 61 associated with the nitrogen-based anneal recipe (see also 51 in FIG. 5).

Figure 7:
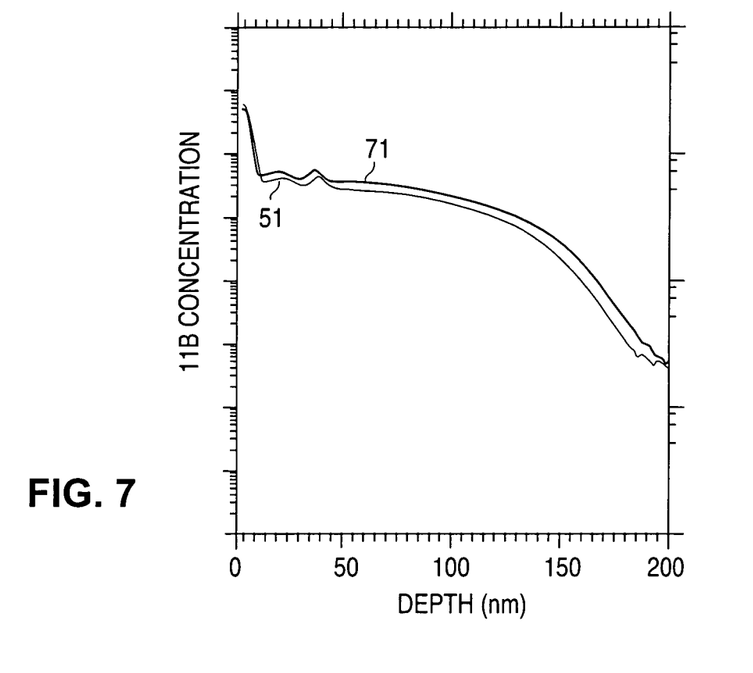
FIG. 7 graphically illustrates how Boron levels resulting from a nitrogen-based anneal recipe are affected when the previous processing step was an ammonia-based step.

FIG. 7 is similar to FIG. 5, but the 11B Boron concentration illustrated at 71 is associated with resistors of a wafer annealed using nitrogen as the process gas, but immediately following a process step that used ammonia as the process gas in the same chamber. In similar fashion to FIG. 5, beyond the 7 nm depth of the screen oxide, the Boron levels at 71 obtained using a nitrogen-based anneal recipe following an ammonia gas processing step are higher than the Boron levels at 51 obtained using a nitrogen-based anneal recipe without residual ammonia gas (ammonia memory effect) in the chamber.

Figure 8:
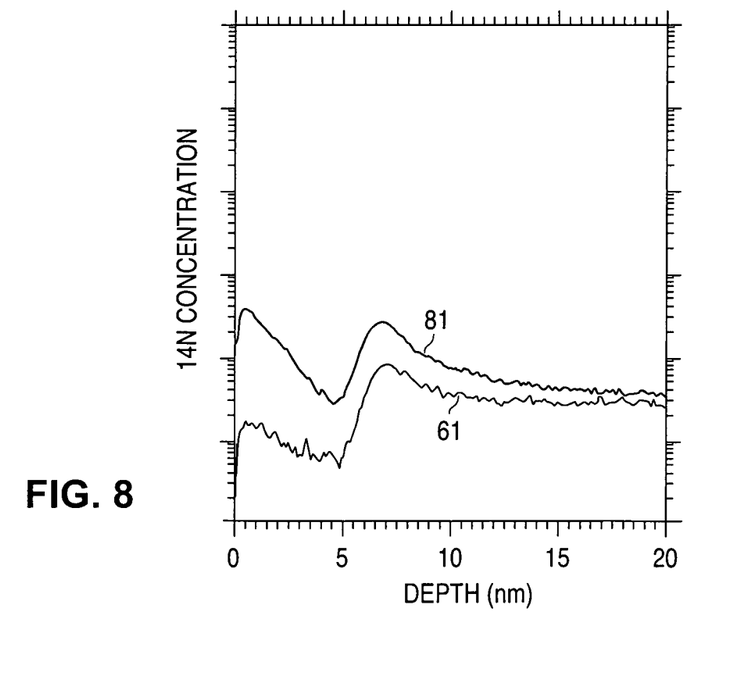
FIG. 8 graphically illustrates how screen oxide nitrogen levels resulting from a nitrogen-based anneal recipe are affected when the previous processing step was an ammonia-based step.

FIG. 8 is similar to FIG. 6, but illustrates screen oxide 14N nitrogen levels 61 and 81 associated with the respective Boron levels 51 and 71 of FIG. 7. Similarly to FIG. 6, the nitrogen levels in the 7 nm screen oxide are higher as a result of using the nitrogen-based anneal recipe after an ammonia-based processing step, as shown by curve 81.

The increased nitrogen levels illustrated at 62 and 81 in FIGS. 6 and 8 indicate that the ammonia ($NH_3$) gas can cause increased nitridation in the screen oxide. This more heavily nitrided oxide would reduce Boron segregation (out-diffusion) into the screen oxide, thereby effectively increasing the Boron concentration at the surface of the doped silicon that adjacently underlies the screen oxide. This explains the tightened resistivity distribution illustrated at 41 in FIG. 4, as well as the associated downward shift in the values of the resistivity distribution exhibited at 41.

Figure 9:
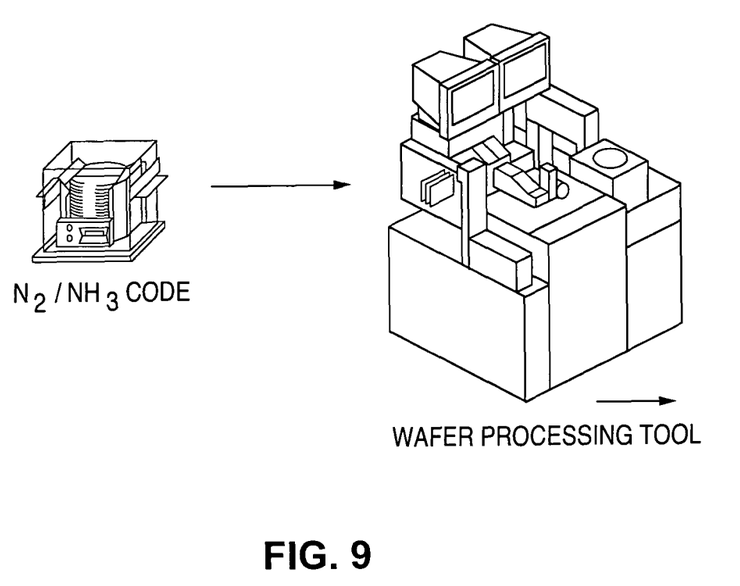
FIG. 9 illustrates an anneal process which uses both ammonia and nitrogen process gases according to exemplary embodiments of the invention.

Exemplary embodiments of the invention achieve tighter resistivity distributions by including ammonia gas in the anneal recipe. As shown in the example of FIG. 9, an anneal recipe that includes both ammonia gas flow and nitrogen gas flow in the chamber of the wafer processing tool is utilized to implement the final anneal operation.

Figure 10:
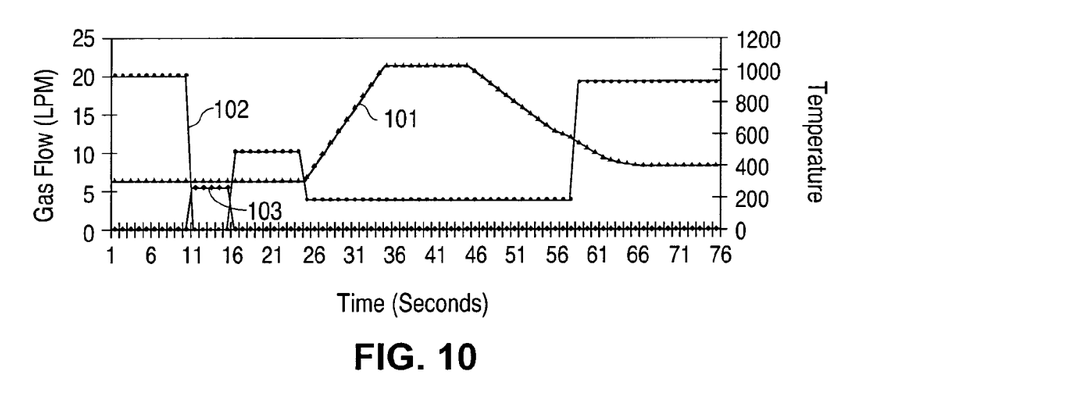
FIG. 10 graphically illustrates an example of an anneal recipe that includes both ammonia and nitrogen gas flows according to exemplary embodiments of the invention.

FIG. 10 illustrates a specific example of an anneal recipe according to the invention. In FIG. 10, temperature is designated at 101, nitrogen gas flow is designated at 102, and ammonia gas flow is designated at 103. As shown in FIG. 10, after about 11 seconds of about 20 LPM nitrogen gas flow at about 250° C., the nitrogen gas flow 102 is eliminated and replaced with about 5 LPM of ammonia gas flow for about 5 seconds at about 250° C., after which the ammonia gas flow is eliminated and replaced with nitrogen gas flow of about 10 LPM at about 250° C. This continues for about 8 seconds until the nitrogen gas flow is reduced to about 4 LPM and the temperature begins ramping up toward 1000° C. The nitrogen gas flow is maintained at about 4 LPM for about 34 seconds. During these 34 seconds, the temperature ramps up to about 1000° C. over about a 10 second period, is maintained at about 1000° C. for approximately 14 seconds, then ramps downwardly to about 600° C. During the final 18 seconds of the recipe, the nitrogen gas flow is maintained at about 20 LPM, while the temperature tapers gradually from about 600° C. to about 400° C. over about the first 9 seconds of this period, and then remains at about 400° C. for about the last 9 seconds of the recipe.

Figure 12:
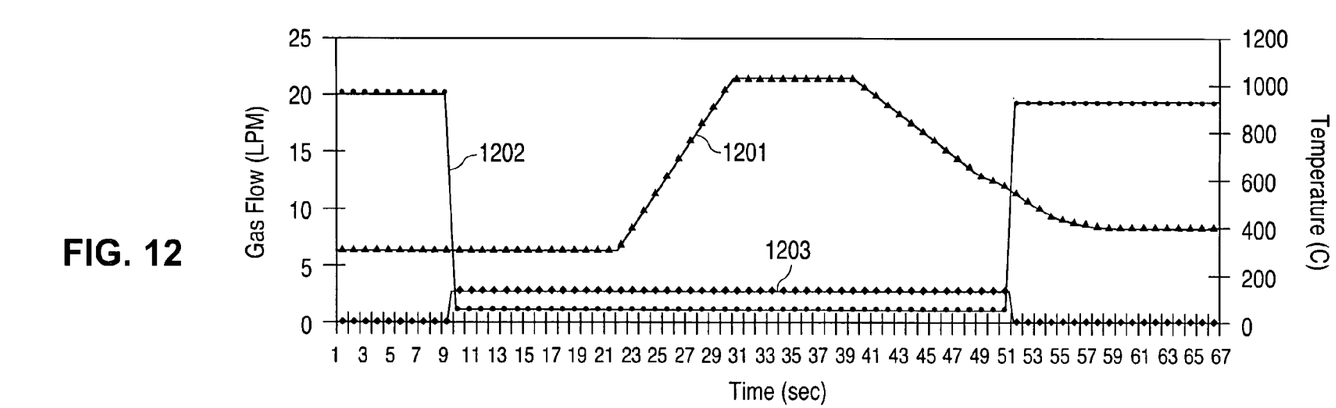
FIG. 12 graphically illustrates an example of an anneal recipe that includes both ammonia and nitrogen gas flows according to exemplary embodiments of the invention.

FIG. 12 illustrates another specific example of an anneal recipe according to the invention. In FIG. 12, temperature is designated at 1201, nitrogen gas flow is designated as 1202, and ammonia gas flow is designated at 1203. As shown in FIG. 12, after about 11 seconds of about 20 LPM nitrogen gas flow at about 250° C., the nitrogen gas flow 1202 is reduced to about 1 LPM, and an ammonia gas flow of about 3 LPM is initiated. This gas flow state is maintained for about the next 40 seconds. Beginning at about 15 seconds into the anneal recipe, the temperature ramps up over about the next 10 seconds from about 250° C. to about 1,000° C., where it is maintained for about 15 seconds, after which it then begins to taper gradually downwardly to reach a level of about 400° C. for about the last 10 seconds of the recipe. At about 52 seconds into the recipe, the nitrogen gas flow is increased from about 1 LPM to about 20 LPM, and the ammonia gas flow is removed. Both of these gas flow changes occur when the temperature is still above 400° C. as it tapers toward about 400° C.

Referring again to FIG. 4, and as mentioned above, the tighter resistivity distribution that can be obtained by incorporating ammonia gas into the anneal recipe also results in an overall reduction in the actual resistance values obtained. The amount of dopant implanted into the silicon material can be readily adjusted to compensate for the observed reduction in resistance values, thereby permitting the tighter resistivity distributions associated with the use of ammonia to be effectively exploited at any desired target resistance value. Such a compensating dopant adjustment is well within the skill of workers in the art.

Figure 11:
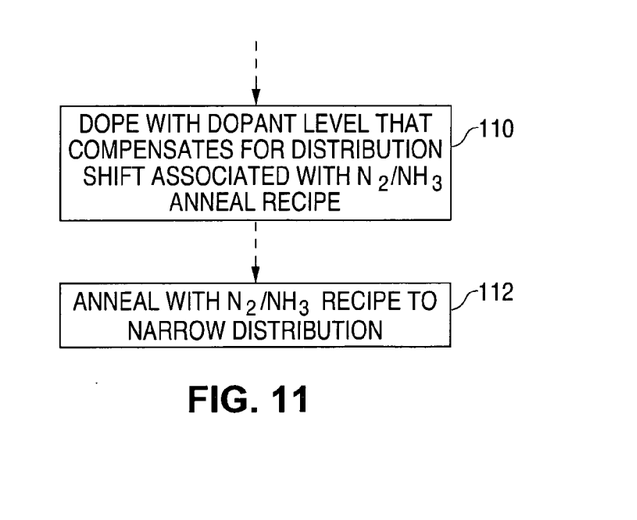
FIG. 11 illustrates operations which can be used according to exemplary embodiments of the invention to manufacture resistors in semiconductor integrated circuits.

FIG. 11 illustrates exemplary operations according to the invention for manufacturing resistors in semiconductor integrated circuits. The broken line operational connections of FIG. 11 are intended to illustrate that certain operations that are not necessary to understanding the invention may be omitted for purposes of clarity. At 110, the silicon is doped with a dopant level that will suitably compensate for the shift in the resistivity distribution associated with the use of an ammonia/nitrogen anneal recipe. Some embodiments use 11B Boron as the dopant. At 112, the anneal step is performed using a combination nitrogen/ammonia anneal recipe (e.g., as shown in FIG. 10) to narrow the resistivity distribution.

Although the present invention has been described with exemplary embodiments, various changes and modifications may be suggested to one skilled in the art. It is intended that the present invention encompass such changes and modifications as fall within the scope of the appended claims.

What is claimed is:

1. In a method of manufacturing a resistor structure which can exhibit any resistance value within a range of resistance values that includes a resistance value that is desired for the resistor structure, including implanting an amount of dopant in a semiconductor material to form a doped semiconductor region, and annealing the doped semiconductor region according to an anneal recipe, the improvement comprising:
   using in said annealing step an adjusted anneal recipe that effectuates a reduction in said range of resistance values and also effectuates a shifting of said range of resistance values relative to said desired resistance value;
   wherein said adjusted anneal recipe comprises three gas flows, the three gas flows comprising a first process gas flow that is followed by a separate ammonia only gas flow that is followed by a second process gas flow; and
   using in said implanting step an adjusted amount of said dopant to compensate for said shifting of said range of resistance values.

2. The method of claim 1, wherein said separate ammonia only gas flow occurs at a different temperature than said first process gas flow and said second process gas flow.

3. The method of claim 1, wherein said shifting of said range of resistance values is downwardly relative to said desired resistance value.

4. A method of manufacturing a resistor structure, comprising:
   implanting a dopant in a semiconductor material to form a doped semiconductor region; and
   annealing the doped semiconductor region according to an anneal recipe that includes a first nitrogen gas flow and a separate ammonia only gas flow and second nitrogen gas flow.

5. The method of claim 4, wherein said first nitrogen gas flow is followed by said ammonia only gas flow in said anneal recipe.

6. The method of claim 4, wherein said ammonia only gas flow and said first and second nitrogen gas flows occur at substantially the same temperature in said anneal recipe.

7. The method of claim 4, wherein said first and second nitrogen gas flows occur at a different temperature in said anneal recipe than does said ammonia only gas flow.

8. The method of claim 4, wherein said ammonia only gas flow is followed by said second nitrogen gas flow in said anneal recipe.

9. The method of claim 8, wherein said second nitrogen gas flow occurs at a different temperature in said anneal recipe than does said ammonia only gas flow.

10. The method of claim 5, wherein said ammonia only gas flow occurs at a different temperature than said first nitrogen gas flow in said anneal recipe.

11. The method of claim 8, wherein said first nitrogen gas flow and said ammonia only gas flow and said second nitrogen gas flow occur at substantially the same temperature in said anneal recipe.

12. The method of claim 4, wherein said ammonia only gas flow is maintained at a substantially constant rate in said anneal recipe.

13. The method of claim 4, wherein said anneal recipe includes a plurality of nitrogen gas flows that are temporally non-overlapping relative to said ammonia only gas flow.

14. The method of claim 4, wherein said anneal recipe includes a nitrogen gas flow that occurs concurrently with said separate ammonia only gas flow and a gas flow rate of said separate ammonia only gas flow is greater than a gas flow rate of said nitrogen gas flow.

15. The method of claim 14, wherein said separate ammonia only gas flow has a flow rate at least twice as high as a flow rate of said nitrogen gas flow.

16. The method of claim 4, wherein said dopant includes Boron.

17. In a method of manufacturing a resistor structure, including implanting a dopant in a semiconductor material to form a doped semiconductor region, and annealing the doped semiconductor region and an adjacent oxide layer according to an anneal recipe that effectuates a diffusion of said dopant from the doped semiconductor region into the oxide layer, the improvement comprising:
   using in said annealing step an adjusted anneal recipe to reduce said diffusion of said dopant into the oxide layer;
   wherein said adjusted anneal recipe comprises at least three gas flows, the at least three gas flows comprising: a first process gas flow that is followed by an ammonia only gas flow that is followed by a second process gas flow.

18. The method of claim 17, wherein the adjusted anneal recipe effectuates an increase in a concentration of said dopant at a surface of the doped semiconductor material which adjoins the oxide layer.

19. The method of claim 18, wherein the adjusted anneal recipe effectuates an increased nitridation of the oxide layer.

20. The method of claim 17, wherein the adjusted anneal recipe effectuates an increased nitridation of the oxide layer.

* * * * *